United States Patent [19]

Fritz

[11] Patent Number: 5,057,461
[45] Date of Patent: Oct. 15, 1991

[54] METHOD OF MOUNTING INTEGRATED CIRCUIT INTERCONNECT LEADS RELEASABLY ON FILM

[75] Inventor: Galen F. Fritz, Plano, Tex.

[73] Assignee: Texas Instruments Incorporated, Dallas, Tex.

[21] Appl. No.: 27,716

[22] Filed: Mar. 19, 1987

[51] Int. Cl.$^5$ .......................................... H01L 21/06
[52] U.S. Cl. .................................. 437/220; 437/209; 437/217; 437/212; 29/827
[58] Field of Search .............. 437/220, 217, 209, 206, 437/212; 29/827, 841; 156/52; 206/330

[56] References Cited

U.S. PATENT DOCUMENTS

| | | | |
|---|---|---|---|
| 3,440,027 | 4/1969 | Hugle | 206/330 |
| 3,785,895 | 1/1974 | Ettre et al. | 156/89 |
| 4,100,675 | 7/1978 | Landsittel | 437/206 |
| 4,697,885 | 10/1987 | Minowa et al. | 156/52 |

Primary Examiner—Brian E. Hearn
Assistant Examiner—Michael Trinh
Attorney, Agent, or Firm—B. Peter Barndt; James T. Comfort; Melvin Sharp

[57] ABSTRACT

A method and film/interconnect lead combination for attaching a plurality of sets of interconnect leads on a strip of film using an adhesive which loses bonding strength upon being exposed to energy such as heat or ultra violet light. The film holds the interconnect leads firmly in their proper position for bonding to an integrated circuit chip and to a leadframe or substrate such as a printed wiring board or a ceramic substrate for hybrid circuits. Either during or after bonding the interconnect leads to the leadframe or substrate, energy is applied to the adhesive holding the interconnect leads to the film and the film is detached from the interconnect leads in a manner which will not damage the leads due to the reduced adhesive strength. Thus, the leadframe package will not enclose the film.

21 Claims, 3 Drawing Sheets

METHOD OF MOUNTING INTEGRATED CIRCUIT INTERCONNECT LEADS RELEASABLY ON FILM

BACKGROUND OF THE INVENTION

1. Field of the Invention

This invention relates to the manufacture of integrated circuit devices, and in particular, to a process of using interconnect leads for electrically connecting an integrated circuit on a semiconductor chip to a lead frame or substrate.

2. Description of the Related Art

An integrated circuit on a semiconductor chip must be electrically connected to external circuitry. A common way of doing this is to provide bond pads on the surface of the semiconductor chip which are electrically connected to the rest of the integrated circuit. Bonding wires may be used to connect the integrated circuit to the external circuitry by bonding one end of a bonding wire to a bond pad and the other end of the bonding wire to a lead of a lead frame or to circuitry on a substrate such as a circuit board.

Alternatively, the prior art process known as the "tab" (tape automated bonding) system may be used to connect an integrated circuit electrically to the leads of a lead frame, or to a circuit board, by using metallic interconnect leads affixed to a film made of kapton, mylar (trademarked names for 2 Dupont products) or other similar substance. Typically, the interconnect leads are affixed to the film using an epoxy or polyester adhesive. With the tab system, the integrated circuit bond pads each have a plated bump on their surface to which is bonded one end of an interconnect lead. The plated bumps keep the interconnect leads from touching the rest of the integrated circuit. After the interconnect leads are bonded to the bond pads, the other end of each interconnect lead is bonded to one of the leadframe leads or to the circuit board. The film keeps the interconnect leads in the proper position for bonding during both bonding steps. Following bonding, the leadframe or circuit board is then packaged or encapsulated along with the portion of the film adhering to the interconnect leads.

A disadvantage of the tab system is that the film enclosed within the integrated circuit package introduces unnecessary foreign material within the package. In all semiconductor packaging it is highly desirable to eliminate or at least minimize all extraneous materials other than the semiconductor chip and interconnect leads from the package. This requirement is imposed to keep materials out of the package which are prone to adsorb moisture or introduce foreign contaminants, both which adversely affect reliability.

SUMMARY OF THE INVENTION

The invention provides for a process of applying heat to release the film attached to interconnect leads. The heat is applied and the film released after or while bonding the interconnect leads to the integrated circuit and to the leadframe or circuit board. Preferably, the film is made of mylar and the interconnect leads are affixed to the film with a polyester adhesive which loses its adhesive strength with the application of heat. The heated adhesive loses strength sufficiently to allow the film to be pulled or otherwise detached from the interconnect leads without breaking or damaging the leads. So far as is known, there is no prior art process for removing film without damaging the leads.

The process of the invention enables the film to be removed from the interconnect leads so that the final packaged integrated circuit device does not have any film enclosed within. This reduces the likelihood that foreign contaminants will be introduced within the integrated circuit device package. Also, the absence of the film within the package reduces the possibility that moisture will be attracted to the inside of the package.

These and other advantages and features of the invention will be more apparent from reading the specification in conjunction with the figures.

DESCRIPTION OF THE PREFERRED EMBODIMENTS

Figure 1:
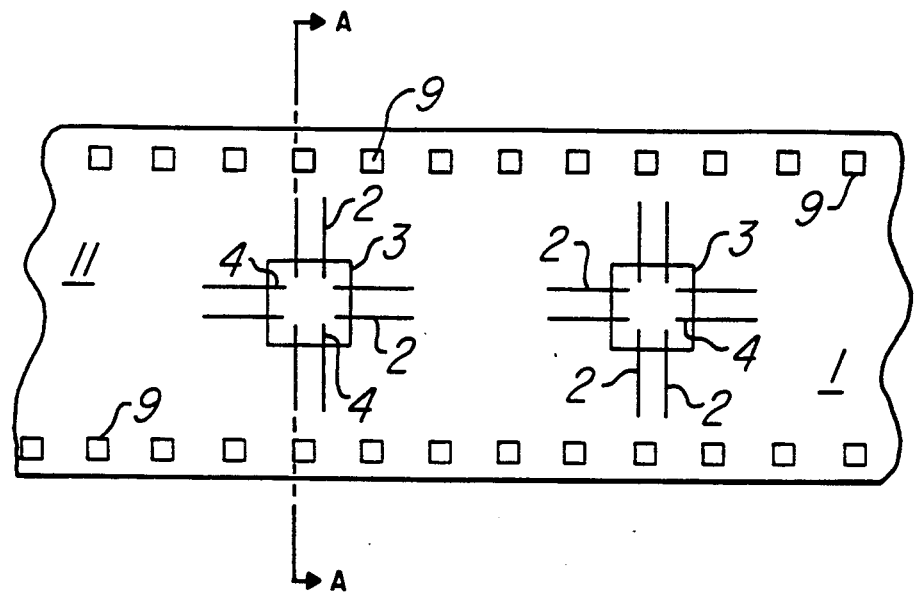
FIG. 1 is a plan view showing a section of film having two sets of interconnect leads affixed thereto and having two chip holes for placement of a semiconductor chip in each hole.
Figure 2:
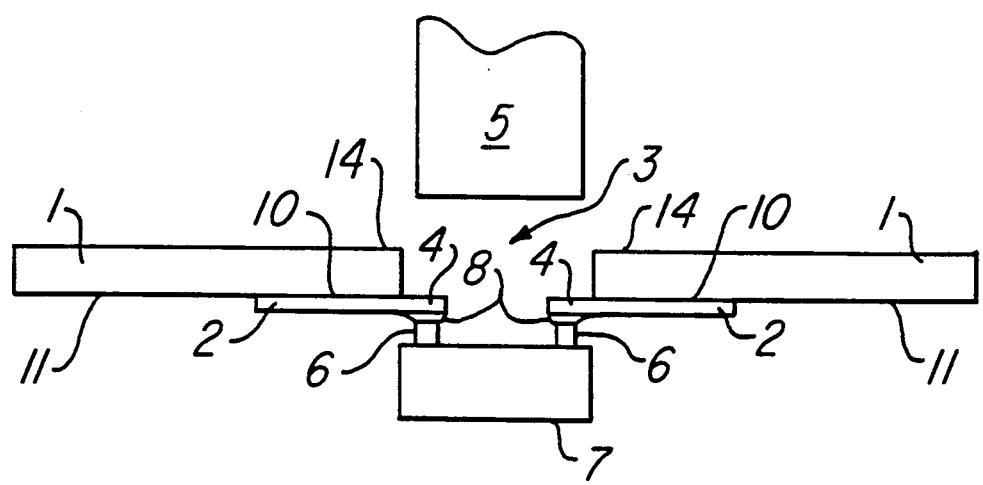
FIG. 2 is an edge view of the film and leads of FIG. 1 taken along section line A—A, and also includes a semiconductor chip attached to the leads and a sectional view of a gang bonding tool.

The invention can be used with the film 1 and interconnect leads 2 shown in FIG. 1. Chip holes 3 are square openings in the film 1 into which interconnect lead ends 4 project a sufficient distance to allow them to be thermocompressively bonded to the bumps 6 of a semiconductor chip 7 by a gang bonder 5, as shown in FIG. 2. The bumps 6 are metallic projections plated on metallized bond pads which are disposed upon the surface 16 of the semiconductor chip 7. The bond pads are the contact points by which electrical contact is established with the integrated circuit on the surface 16 of the semiconductor chip 7. As shown in FIG. 2, chip hole 3 is sufficiently wide to admit gang bonder 5 to pass through to make contact with interconnect lead ends 4. Although thermocompression bonding is preferred, thermosonic bonding or a reflow solder process can be used to produce bonds 8 between the bumps 6 and the interconnect lead ends 2.

As seen in FIG. 1, the film 1 is provided with sprocket holes 9 for engagement with a sprocket for advancing the film into proper position for attachment of the semiconductor chip 7 to the interconnect lead ends 4.

Figure 3:
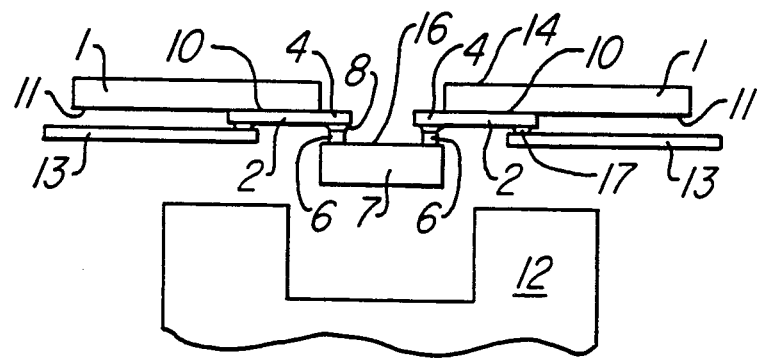
FIG. 3 is a view similar to that of FIG. 2, also including a view of a leadframe attached to the interconnect leads and a sectional view of a heater block. The gang bonding tool is not shown.
Figure 4:
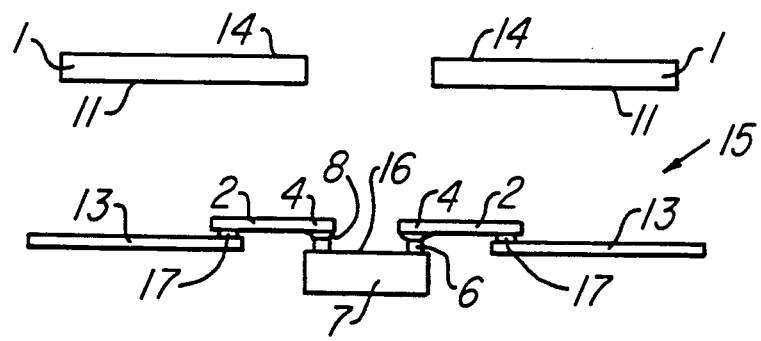
FIG. 4 is a view similar to that of FIG. 3 except that the film is shown pulled away from the interconnect leads, and the heater block is not illustrated.

Returning to FIG. 2, the interconnect leads 2 are affixed to the surface 11 of the film 1 by a heat degradable polyester adhesive at the interface 10 between the interconnect leads and the film. Heater block 12, shown in FIG. 3, is used to supply the heat for a reflow solder process to bond the interconnect leads 2 to the leadframe 13 by forming solder joints 17. Preferably, heater block 12 also supplies the heat necessary to degrade the polyester adhesive at the interfaces 10. Heat supplied to the polyester adhesive causes the adhesive to degrade and to lose its binding strength so that the film 11 can easily be pulled away from the interconnect leads 2, as shown in FIG. 4. Instead of relying upon the heater block 12 to supply the heat necessary to cause the adhesive to release the film 1 from the interconnect leads 2, heat may be applied to the area 14 of the film overlying the interconnect leads 2.

The combination 15 of bonded leadframe 13, interconnect leads 2, and semiconductor chip 7, as shown in FIG. 4, is ready for packaging by any of the conventional means known to the art, such as by molding of a plastic package. The plastic film 1 has been pulled from the interconnect leads 2 and will not be encapsulated within the package.

Figure 5:
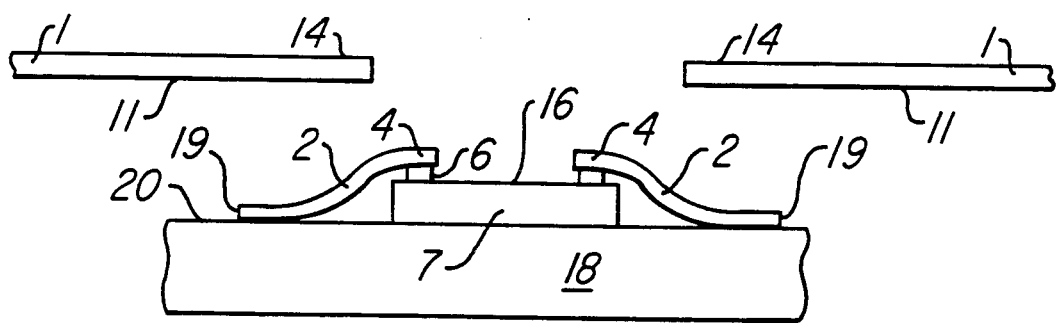
FIG. 5 shows another application for the invention, a side view of a semiconductor chip mounted on a circuit board, with interconnect leads electrically connecting the chip to the circuit board. The film is shown pulled away from the interconnect leads.

As shown in FIG. 5, the invention can also be practiced in the case where the interconnect leads 2 are bonded to circuit board 18 at 19. The circuit board 18 has a metallized circuit pattern on its upper surface 20, and it is to this metallization that the interconnect leads are bonded, preferably by reflow soldering. The metallized circuit pattern on the upper surface 20 is for electrically connecting the integrated circuit on semiconductor chip 7 to external circuitry. Examples of such circuit boards 18 are printed wiring boards and ceramic substrates for hybrid circuits.

Figure 6:
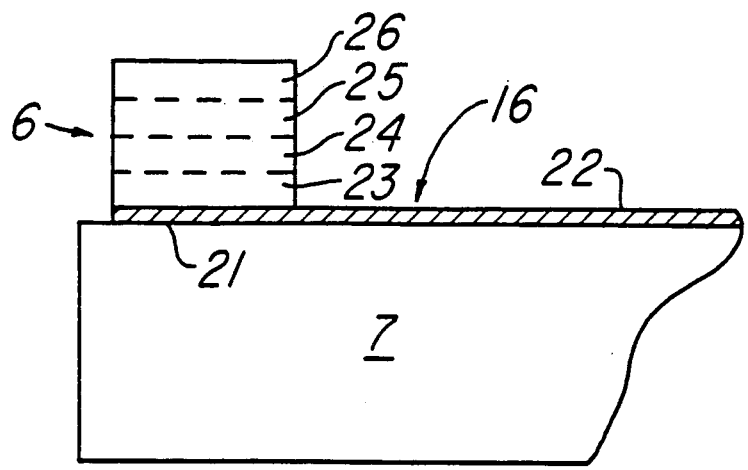
FIG. 6 is a side, sectional view of a semiconductor chip with a detailed view of a plated bump on a bond pad. The dashed lines indicate the interfaces between various plated on layers of metallization.

FIG. 6 illustrates the preferred structure for the bump 6. The bump is sputtered and plated on the metallized bond pad 21 which is electrically connected to the metallized circuitry 22 on the upper surface 16 of the semiconductor chip 7. The purpose of the bump is to form an electrical connection with the interconnect leads 2 and to keep the interconnect leads from coming into electrical contact with any of the rest of the circuitry on the upper surface 16 of the semiconductor chip 7. The first layer 23 is chromium and the second layer 24 is nickel, both of which are sputtered onto the metallized bond pad 21. The third layer 25 consists of copper and is plated onto the nickel layer 24, while the topmost layer 26 is of gold and is plated onto the copper layer 25. The chromium layer functions as an adhesion and barrier layer to prevent the aluminum bond pad from coming into contact with the copper or gold layers to prevent undesirable side effects such as inter-metallics from occurring. The nickel layer 24 also acts as a barrier layer. The chromium 23 and nickel 24 layers are relatively thin in comparison with the copper layer 25 which is thick in comparison with the other layers of the bump. The gold layer 26 is relatively thin and functions to provide a good oxide-free electrical contact for the bump 6. Another possible bump structure consists of a titanium/tungsten alloy adhesion and barrier layer deposited on the bond pad with a copper layer on that layer and an outer layer of gold.

Figure 7:
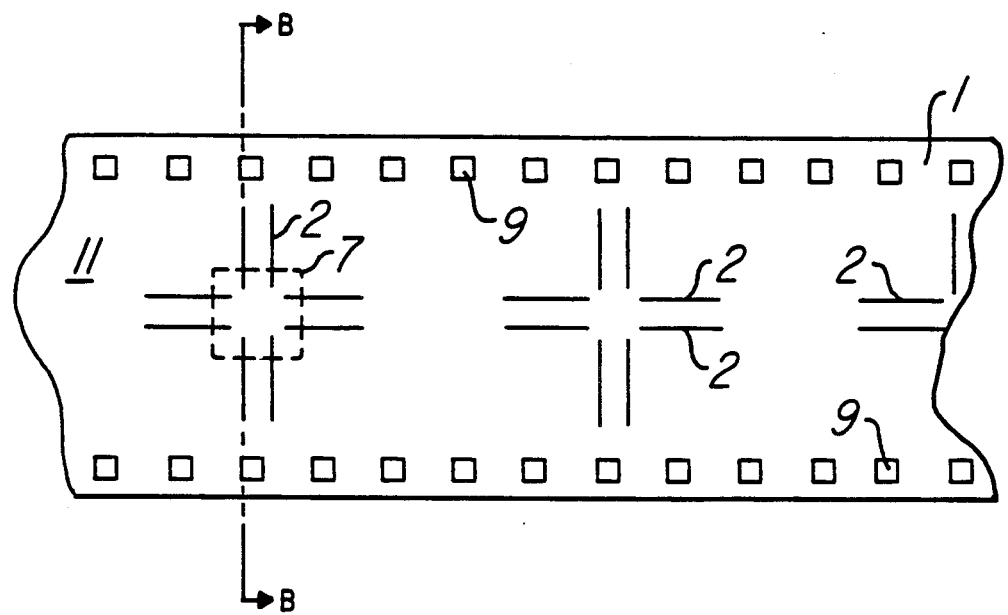
FIG. 7 is a plan view showing a section of film having two complete sets of interconnect leads and showing one set of interconnect leads in section. This application of the invention does not include chip holes in the film.
Figure 8:
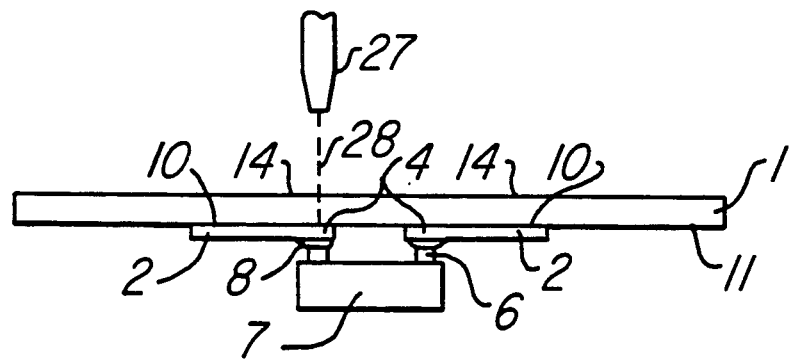
FIG. 8 is an edge view of the film and leads of FIG. 7 taken along section line B-B, and also includes a semiconductor chip attached to the leads and a sectional view of a laser bonder.

FIGS. 7 and 8 illustrate another embodiment of the invention. Shown is a translucent film 1 with interconnect leads 2 on the surface 11, but which has no chip holes 3, thus saving the expense of providing them. The dotted square 7 in FIG. 7 indicates the position that the semiconductor chip will occupy after it is bonded to the leads 2 as shown in FIG. 8. Instead of using the gang bonder 5 shown in FIG. 2, the bumps 6 are bonded to the leads 2 at 8 by laser bonder 27. The film 1 is translucent to the wavelength of the laser and passes the laser beam 28 so that the beam strikes and heats the interconnect lead ends 4. The interconnect lead ends 4 are heated sufficiently to reflow solder the bumps 6 to the leads 2 at 8. After bonding, the film 1 is heated in the region 14 to cause the polyester adhesive at the interface 10 between the leads 2 and the surface 11 of the film 1 to release the leads 2 from the film 1.

Although the described embodiments of the invention utilize a polyester adhesive to affix the interconnect leads 2 to the film 1, it is within the scope of the invention to use any adhesive which relaxes its bonding strength upon being heated. Also contemplated by the invention are adhesives which similarly relax their bonding strength upon exposure to other external stimuli, such as ultra violet light. A major requirement is that the adhesive of choice relax its bonding strength sufficiently to allow the film 1 to be pulled or peeled from the interconnect leads 2 without breaking or weakening them.

I claim:

1. A method of assembling a semiconductor device, comprising the steps of:
   providing film to which a plurality of metallic interconnect leads are affixed with a heat releasable adhesive;
   bonding a semiconductor chip to the interconnect leads;
   bonding a leadframe to the interconnect leads; and
   applying heat to the adhesive to reduce its bonding strength.

2. The method of claim 1 further comprising the steps of:
   detaching the film from the interconnect leads.

3. The method of claim 2 wherein the adhesive is a polyester adhesive.

4. The method of claim 2 wherein the step of detaching the film from the interconnect leads is carried out while carrying out the step of applying heat to the adhesive.

5. The method of claim 2 wherein the heat applied to the adhesive is generated by the step of bonding the leadframe to the interconnect leads.

6. A method of fabricating a semiconductor device, comprising the steps of:
   providing film to which a plurality of metallic interconnect leads are affixed with an adhesive whose bonding strength is diminished by heat;
   bonding an integrated circuit to the interconnect leads;
   bonding a leadframe to the interconnect leads;
   applying heat to the adhesive; and
   detaching the film from the interconnect leads while the adhesive is hot.

7. The method of claim 6 wherein the step of bonding the integrated circuit to the interconnect leads is carried out with a laser bonder.

8. The method of claim 7 wherein the film is translucent to the light of the laser bonder and the step of laser bonding is carried out by directing a laser beam through the film to impact upon the interconnect leads to supply the heat necessary for the bonding process.

9. The method of claim 6 wherein the heat applied to the adhesive is a by-product of the step of bonding the leadframe to the interconnect leads.

10. The method of claim 6 wherein the film is a strip of film with a plurality of sets of interconnect leads, wherein each set of interconnect leads accommodates one integrated circuit.

11. The method of claim 6 further comprising the step of:
    encapsulating the combination of integrated circuit, interconnect leads, and part of the leadframe in a package.

12. The method of claim 11 wherein the package is a plastic package.

13. A method of assembling a semiconductor device, comprising the steps of:
    providing film to which a plurality of metallic interconnect leads are affixed with an adhesive whose bonding strength is diminished by heat;
    bonding an integrated circuit to the interconnect leads;
    bonding a substrate to the interconnect leads;
    applying heat to the adhesive; and
    detaching the film from the interconnect leads while the adhesive is hot.

14. The method of claim 13 wherein the substrate is a printed wiring board.

15. The method of claim 13 wherein the substrate is comprised of ceramic and is for a hybrid circuit.

16. A method of fabricating a semiconductor device, comprising the steps of:
    providing film to which a plurality of metallic interconnect leads are affixed with an adhesive which relaxes its bonding strength upon having energy directed upon it;
    bonding an integrated circuit to the interconnect leads;
    bonding a leadframe to the interconnect leads;
    directing energy upon the adhesive from an energy source; and detaching the film from the interconnect leads.

17. The method of claim 16 wherein the energy is heat and the energy source is a heat source.

18. The method of claim 16 wherein the energy is ultra violet light and the energy source is a source of ultra violet light.

19. The method of claim 16 wherein the film includes at least one chip hole associated with the plurality of interconnect leads.

20. The method of claim 16, further comprising the step of:
    encapsulating the combination of the integrated circuit, interconnect leads and a portion of the leadframe in a package.

21. The method of claim 16 wherein the integrated circuit includes bond pads having bumps to which the interconnect leads are bonded during the step of bonding the integrated circuit to the interconnect leads.

* * * * *